US006769106B2

(12) United States Patent
Hasegawa

(10) Patent No.: US 6,769,106 B2
(45) Date of Patent: Jul. 27, 2004

(54) METHOD OF WIRING SEMICONDUCTOR INTEGRATED CIRCUIT, SEMICONDUCTOR INTEGRATED CIRCUIT, AND COMPUTER PRODUCT

(75) Inventor: Takao Hasegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 170 days.

(21) Appl. No.: 10/073,328

(22) Filed: Feb. 13, 2002

(65) Prior Publication Data

US 2003/0014726 A1 Jan. 16, 2003

(30) Foreign Application Priority Data

Jul. 16, 2001 (JP) ........................................ 2001-215793

(51) Int. Cl.[7] ............................................. G06F 17/50
(52) U.S. Cl. ............................................. 716/12; 716/10
(58) Field of Search ................................ 716/1, 2, 8, 9, 716/10, 11, 12, 13, 14, 15, 16

(56) References Cited

U.S. PATENT DOCUMENTS 5,375,069 A * 12/1994 Satoh et al. ................. 364/490
6,014,507 A * 1/2000 Fujii ............................ 716/12
6,480,995 B1 * 11/2002 Schmidt et al. ............... 716/11
6,484,301 B1 * 11/2002 Burden .......................... 716/8
6,484,302 B1 * 11/2002 Freymuth .................... 716/10
6,536,027 B1 * 3/2003 Grinchuk et al. ............. 716/12

FOREIGN PATENT DOCUMENTS

| JP | 8-306786 | 11/1996 |
| JP | 9-62724 | 3/1997 |
| JP | 10-125775 | 5/1998 |

* cited by examiner

Primary Examiner—Leigh M. Garbowski
(74) Attorney, Agent, or Firm—Leydig, Voit & Mayer, Ltd.

(57) ABSTRACT

The wiring method includes determining wirings based on a condition that one through-hole is formed; picking up a pair of wirings that are disposed on different layers and that need to be electrically connected to each other, from among the determined wirings, and extracting areas occupied by the wirings; making a decision about whether there exist areas that coincide with each other between the wirings; making a decision about whether the coincident areas have space sufficient for an additional through-hole; and setting an additional through-hole on the coincident areas with sufficient space.

6 Claims, 11 Drawing Sheets

METHOD OF WIRING SEMICONDUCTOR INTEGRATED CIRCUIT, SEMICONDUCTOR INTEGRATED CIRCUIT, AND COMPUTER PRODUCT

FIELD OF THE INVENTION

The present invention relates to a technology capable of reducing resistance in the wiring or capable of improving the process yield by setting a new through-hole in addition to a through-hole for connecting between wires disposed in different layers in a semiconductor integrated circuit having a multi-layer structure, without changing the wiring already set by the conventional method.

BACKGROUND OF THE INVENTION

The number of circuit elements mounted on a semiconductor integrated circuit has been increasing exponentially in recent years. For example, 2.2 million circuit elements are mounted on a one-mega-bit dynamic random access memory (DRAM). The area of a plane that constitutes a circuit is limited. Moreover, the performance of the circuit is controlled by the wiring patterns. Therefore, how to structure the layout of the large number of circuit elements and the wiring for connecting between the circuit elements is an extremely important task. It is not suitable to carry out all the wiring process by hand from the viewpoint of development time and precision. Therefore, the layout of the circuit elements and the wiring patterns are determined automatically on a computer by using the technology of computer aided designing (CAD), as a main practice at present.

FIG. 11 is a schematic view showing a part of a semiconductor integrated circuit having a multi-layer structure that has been wired according to a conventional method. FIG. 11 is a transmission view of a semiconductor integrated circuit consisting of a first layer and a second layer, looked at from vertically above the circuit surface. The wiring disposed on the first layer and the wiring disposed on the second layer are shown in one plane. The a-wiring 1, a-wiring 2, b-wiring 3, and the c-wiring 4 are the wirings disposed on the first layer. The A-wiring 8, D-wiring 9, and the E-wiring 10 are the wirings disposed on the second layer. The a-wiring 1 and 2, and the A-wiring 8 transmit the same electric signal, and other wirings transmit mutually different electric signals.

An insulation layer is disposed between the first layer and the second layer, thereby to insulate the wirings belonging to one layer from those of the other layer. It is necessary to electrically connect between the a-wiring 1 and the A-wiring 8, and between the a-wiring 2 and the A-wiring 8 respectively, as these wirings handle the same signal. For this purpose, the a-wiring 1 and the A-wiring 8 are connected to each other via the through-hole 5, and the a-wiring 2 and the A-wiring 8 are connected to each other via the through-hole 6. These through-holes are provided to pierce through the insulation layer sandwiched between the first layer and the second layer, in a direction perpendicular to the circuit surface, respectively. Therefore, it is possible to secure electric conduction between the first layer and the second layer through these through-holes. In order to provide these through-holes, according to a conventional automatic wiring, wiring patterns are set subject to a condition that one through-hole is disposed without exception to a pair of these wirings to be connected to each other. Specifically, in the automatic wiring, a setting area is provided on one of the pair of wirings that needs to be electrically connected to each other, and a corresponding area as a projection of the setting area is provided on the other wiring. With this arrangement, a through-hole is set in a shape that pierces through the insulation layer, and the setting area and the corresponding areas are connected to each other.

However, along with the request for making devices smaller in recent years, there has been progress in reduction in the size of a circuit element and a reduction in the width of wiring. As shown in FIG. 11, a through-hole is set to have a smaller width than that of wiring. Therefore, a cross-sectional area of one through-hole per circuit surface also becomes smaller, corresponding to the reduction in the wiring width. Further, according to the conventional automatic wiring, only one through-hole for electric conduction is provided for a pair of wirings that are disposed in different layers.

The electric resistance of a through-hole is inversely proportional to cross-sectional area of the through-hole. Therefore, as the reduction in size of a semiconductor integrated circuit has progressed, the resistance of the through-hole has increased, and a current flow has become more difficult.

Further, when a cross-sectional area of a through-hole becomes small, it becomes difficult to form the through-hole by that magnitude, and a probability that a disconnection occurs at the through-hole portion in the process of manufacturing a semiconductor integrated circuit increases. When one through-hole has been disconnected, this semiconductor integrated circuit cannot operate even when there is no problem in other portions of the semiconductor integrated circuit. As a result, this semiconductor integrated circuit cannot be shipped as a product. This leads to a reduction in the production yield of semiconductor integrated circuits.

Further, in general, it has been known that electromigration resistance is lowered in inverse proportion to the square of current density. The current density of a through-hole having a smaller cross-section increases when the same level of current flows. This brings about a problem in that the electromigration resistance is lowered.

In the mean time, in the automatic wiring, it has been known as a countermeasure to increase the number of through-holes to be set in a pair of wirings that are disposed on different layers. For example, when a pair of wirings that have so far been connected to each other through one through-hole are connected to each other through two through-holes, the cross-sectional area of the through-holes on the circuit surface increases by this incremental through-hole portion. Therefore, the resistance decreases by that portion, and other problems can also be prevented. This kind of technique has been disclosed in Japanese Patent Application Laid-open No. 9-62724, Japanese Patent Application Laid-open No. 10-125775, and Japanese Patent Application Laid-open No. 8-306786.

However, as the area of planes that constitute a circuit is limited as described above, it is not advantageous to carry out the automatic wiring subject to a condition that a new area for setting a through-hole is provided. In other words, the area that can be used for the circuit elements and the wiring becomes small by the portion of the increase in the through-hole setting area. This makes it necessary to dispose other wiring by detouring around the area for setting the through-hole, leading to a reduction in the degree of freedom of wiring. As a result, the characteristics of the semiconductor integrated circuit are lowered, and it is not possible to carry out the automatic wiring in the worst case.

SUMMARY OF THE INVENTION

It is an object of the present invention to provide a method of wiring a semiconductor integrated circuit, a semiconductor integrated circuit capable of disposing a new through-hole without changing a wiring pattern after once this wiring pattern has been determined. It is another object of this invention to provide a computer program that contains instructions which when executed on a computer realizes the method according to the present invention on the computer.

The method of wiring according to one aspect of the present invention is a method of wiring a semiconductor integrated circuit, the semiconductor integrated circuit having a first layer and a second layer. The method includes the steps of: disposing a first wiring on the first layer and disposing a second wiring on the second layer, wherein the first and second wirings are disposed subject to a condition that a predetermined number of through-holes are set between the first and second wirings, and the first and second layers being electrically connected to each other; searching for a setting area in one of the first and second layers, and an corresponding area in the other of the first and second layers as a projection area of the setting area, that enable a setting of new other through-hole between the first and second wiring that have been determined; and setting the new other through-hole between the setting area and the corresponding area.

According to the above-mentioned aspect, an area in which a new through-hole can be set is searched for after a first wiring and a second wiring have been determined. Therefore, a wiring pattern once determined is not changed. As a result, it is possible to set a new through-hole without sacrificing the other wiring that has been determined at the wiring step.

The method of wiring according to another aspect of the present invention is a method of wiring a semiconductor integrated circuit, the semiconductor integrated circuit having a first layer and a second layer. The method includes: a first wiring step of disposing a first wiring on the first layer and disposing a second wiring on the second layer, wherein the first and second wirings are disposed subject to a condition that a predetermined number of through-holes are set between the first and second wirings, and the first and second layers being electrically connected to each other; an area searching step of searching for a setting area in the first layer, and an corresponding area in the second layer as a projection area of the setting area, that enable a setting of new other through-hole between the first and second wiring that have been determined; a second wiring step of disposing an additional wiring for setting the other through-hole in either the searched setting area or the searched corresponding area; and a through-hole setting step of setting the new other through-hole between the setting area and the corresponding area.

According to the above-mentioned aspect, an additional wiring is disposed at the second wiring step. Therefore, an area in which the wiring has not been disposed at the first wiring step can be used for a setting area and an corresponding area. As a result, it is possible to effectively utilize the areas that have not been utilized at the first wiring step.

The semiconductor integrated circuit according to still another aspect of the present invention includes: a multi-layer structure including a first layer and a second layer; a setting area disposed on the first layer; a corresponding layer disposed on the second layer as a projection area of the setting area; and a through-hole which connects between the setting area and the corresponding area, the through-hole having a shape corresponding to the shapes of the setting area and the corresponding area.

According to this aspect, there is an advantage that it is possible to provide a semiconductor integrated circuit that has a through-hole having a large cross-sectional area as far as possible.

The computer program according to still another aspect of the present invention contains instructions which when executed on a computer realizes the method according to the present invention on the computer.

Other objects and features of this invention will become apparent from the following description with reference to the accompanying drawings.

DESCRIPTION OF THE PREFERRED EMBODIMENTS

Embodiments of the method of wiring the semiconductor integrated circuit, the semiconductor integrated circuit, and the computer program for making a computer execute the wiring method according to the present invention will be explained in detail with reference to the accompanying drawings.

Figure 1:
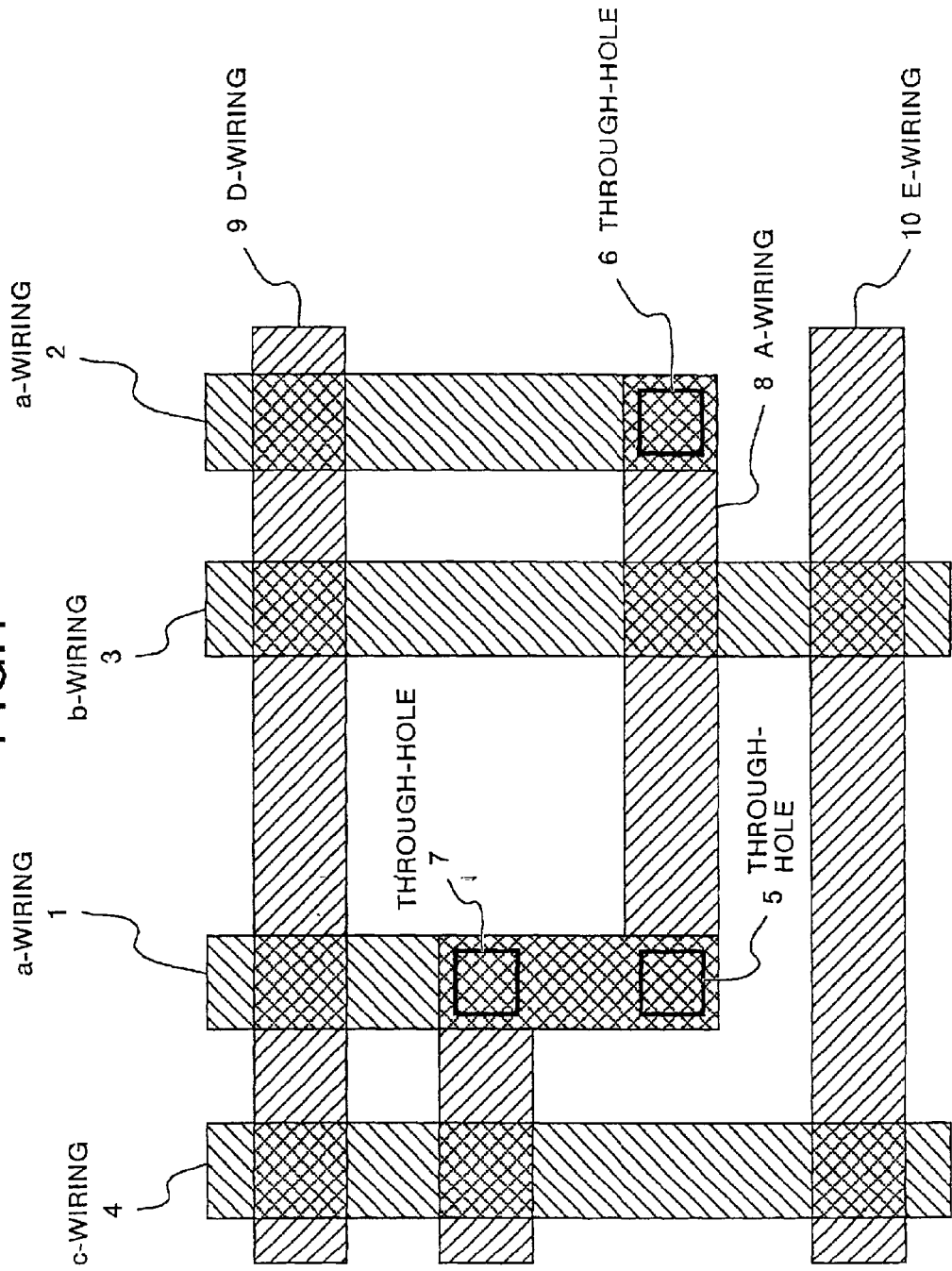
FIG. 1 is a diagram showing a wiring pattern of a semiconductor integrated circuit wired by a wiring method according to a first embodiment of the present invention.
Figure 2:
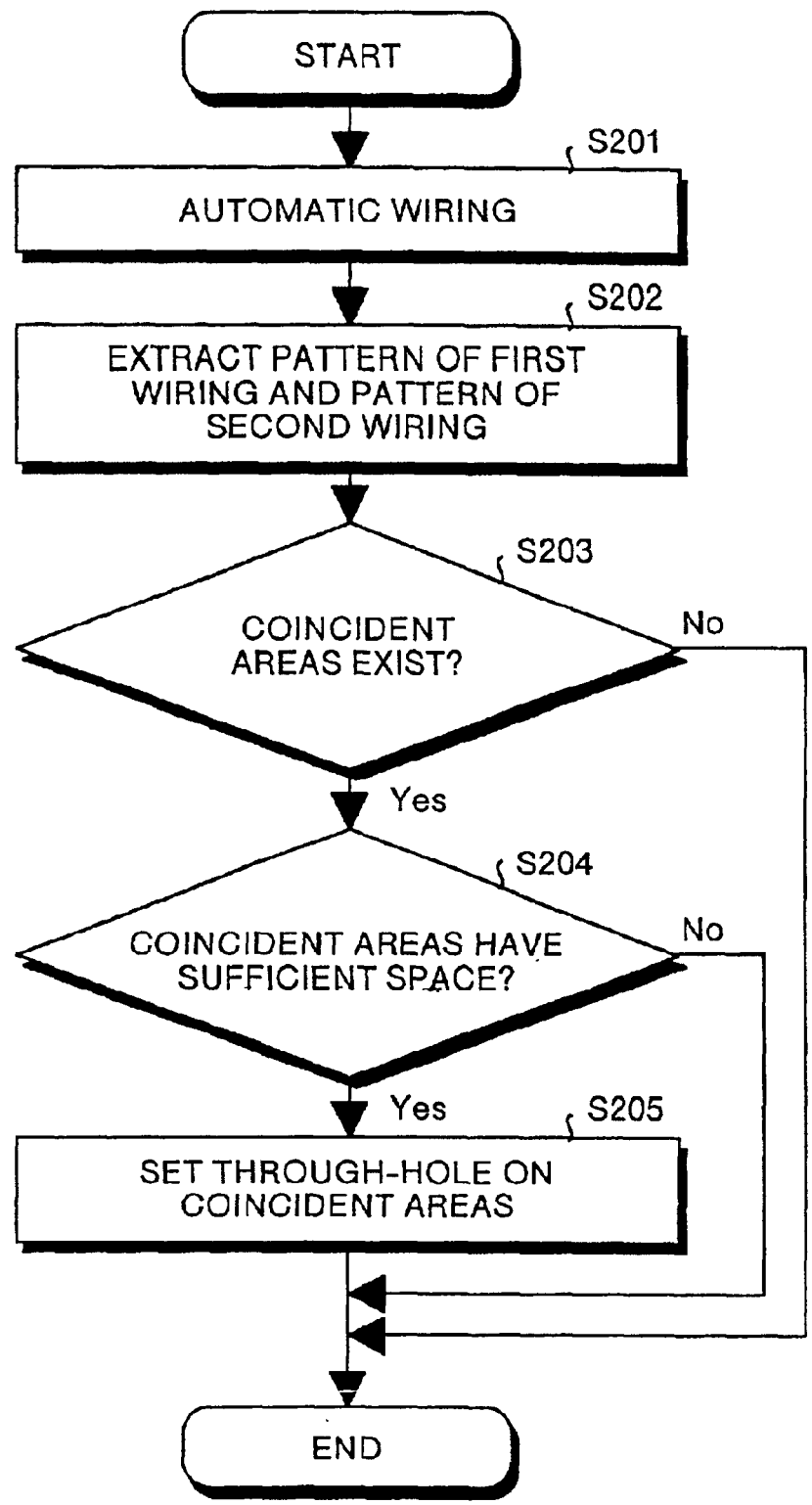
FIG. 2 is a flowchart showing a procedure of the method of wiring a semiconductor integrated circuit according to the first embodiment of the present invention.
Figure 11:
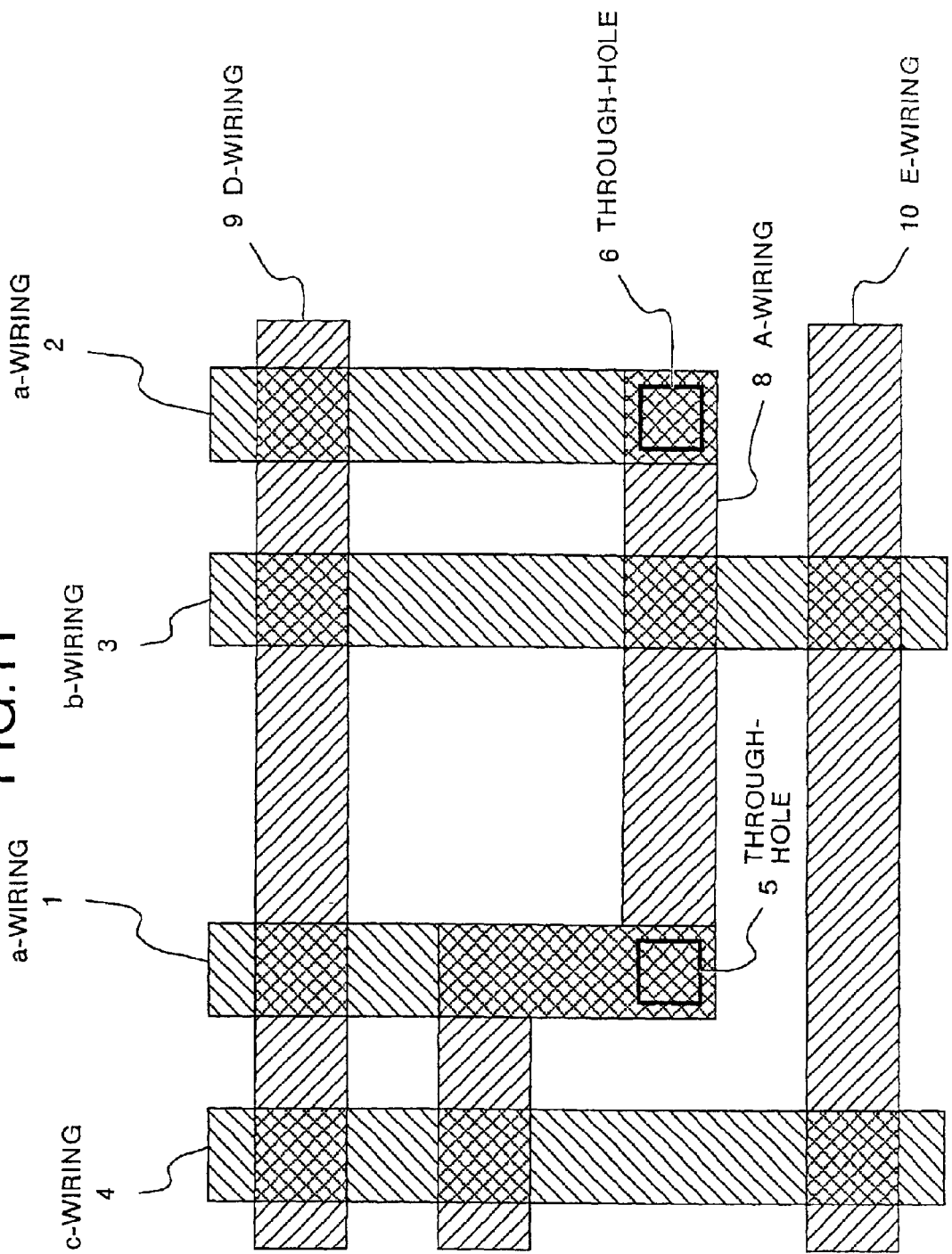
FIG. 11 is a diagram showing wiring of a semiconductor integrated circuit according to a conventional example.

FIG. 1 is a schematic view of a circuit wired by a method of wiring a semiconductor integrated circuit according to a first embodiment of the present invention. FIG. 2 is a flowchart showing an outline of the method of wiring a semiconductor integrated circuit. In FIG. 1, components that perform same or similar functions as those shown in FIG. 11 relating to the conventional technique are provided with like reference numbers and their explanation will be omitted to avoid simple repetition of explanation. This applies to other drawings as well. First, a semiconductor integrated circuit formed by the wiring method according to the first embodiment will be explained.

FIG. 1 is a top plan view of two optional layers superimposed with each other in a semiconductor integrated circuit having a multi-layer structure. Therefore, this shows a status that wirings disposed on one layer (hereinafter to be referred to as a "first layer") and wirings disposed on the other layer (hereinafter to be referred to as a "second layer") are superimposed with each other. In this case, the a-wirings 1 and 2, b-wiring 3, and the c-wiring 4 are wirings disposed on the first layer, and they are extended in a vertical direction respectively. The a-wirings 1 and 2 transmit the same electric signal, and the b-wiring 3 and the c-wiring 4 transmit electric signals different from the electric signals transmitted by the other wirings. The A-wiring 8, D-wiring 9, and the E-wiring 10 are wirings disposed on the second layer, and they are extended basically in a lateral direction respectively. However, the A-wiring 8 has a pattern extended in a vertical direction by only a constant length. The A-wiring 8 is superimposed with the a-wiring 1 at this pattern portion extended in the vertical direction. Further, the wirings disposed on the second layer also transmit electric signals respectively. The A-wiring 8 transmits the same electric signal as that of the a-wiring 1 and the a-wiring 2 disposed on the first layer. The D-wiring 9 and the E-wiring 10 transmit electric signals different from the electric signals transmitted by the other wirings.

The through-hole 6 is set in an area where the a-wiring 2 and the A-wiring 8 are superimposed with each other, and the a-wiring 2 and the A-wiring 8 are electrically connected to each other. There is an area in which a pair of wirings that transmit mutually different electric signals exist, for example, an area in which the a-wiring 1 and the D-wiring 9 are superimposed with each other. However, it is not necessary to electrically connect between these wirings through a through-hole, and these wirings are in an insulated status.

In the mean time, two through-holes 5 and 7 are set in two areas between the a-wiring 1 and the A-wiring 8. This pattern is different from that of the conventional circuit in which only the through-hole 5 is set in one place. When the number of through-hole for connecting between a pair of wirings disposed in different layers is increased from the conventional number of one to two, there arise the following effects.

First, the total cross-sectional area of the through-holes on the surface of the circuit increases by the portion corresponding to the through-hole that has been increased. As a result, it is possible to restrict resistance to a low level.

Second, the electromigration proof is also improved corresponding to the increase in the cross-sectional area.

Third, it is possible to improve the production yield in the actual production process. Even when any one of the through-hole 5 and the through-hole 7 has not been formed according to a design in the actual manufacturing process, and this through-hole cannot perform its function, the existence of the other through-hole makes it possible to maintain the electric connection at least between the a-wiring 1 and the A-wiring 8. As a result, it is possible to perform the function as the semiconductor integrated circuit.

Next, the method of wiring a semiconductor integrated circuit according to the first embodiment will be explained using a flowchart shown in FIG. 2 by suitably referring to FIG. 1. The wiring of the semiconductor integrated circuit is carried out in the following steps. To facilitate the understanding, the wiring method will be explained taking an example of setting through-holes between the a-wiring 1 and the A-wiring 8.

First, the automatic wiring is carried out for each layer of the semiconductor integrated circuit by using the conventional method (step S201). Based on the use of the CAD, layout of all the circuit elements and all wiring patterns are determined on the computer. Wiring conditions are different depending on semiconductor integrated circuits. At least, it is a condition of the automatic wiring that one through-hole is set, without exception, in a pair of wirings that are disposed in different layers and that need to be connected to each other. In FIG. 1, the through-hole 5 is set to connect between the a-wiring 1 and the A-wiring 8, and the through-hole 6 is set to connect between the a-wiring 2 and the A-wiring 8. As it is the condition of the automatic wiring that one through-hole is set in a pair of wirings to be connected to each other, the through-hole 7 is not set between the a-wiring 1 and the A-wiring 8 at the stage of step S201. The layout of the circuit elements and the wiring patterns determined by the automatic wiring are not changed at subsequent steps.

Next, a pair of wirings to be electrically connected to each other are picked up, and areas occupied by these wirings are extracted (step S202). In the example shown in FIG. 1, the a-wiring 1 disposed on the first layer and the A-wiring 8 disposed on the second layer are selected. Then, the areas occupied by these wirings are extracted.

Next, the extracted wiring patterns on both layers are compared with each other, and it is decided whether there exist areas that coincide with each other or not (step S203) Specifically, the first layer and the second layer are super imposed with each other, and it is decided whether there exist areas that coincide with each other between the two wiring patterns extracted at step S202. When there exist coinciding areas, these areas are extracted. In the example shown in FIG. 1, the first layer from which the a-wiring 1 is extracted and the second layer from which the A-wiring 8 is extracted are superimposed with each other. Then, an area of the pattern of the a-wiring 1 and an area of the pattern of the A-wiring 8 that coincide with each other are searched for. The a-wiring 1 and the A-wiring 8 are superimposed with each other in the area where the A-wiring 8 extends in the vertical direction. Thus, it is decided that there are areas that coincide with each other in this vertically extended area of the A-wiring 8. Of the coincident areas, a portion where the through-hole 5 has already been set is excluded from the coincident area at step S203. It is not necessary to set a new through-hole in this portion. When there are no areas that coincide with each other, it is not possible to set a new through-hole. Therefore, the wiring process finishes.

Next, it is decided whether the coincident areas extracted at step S203 have sufficient space for setting a through-hole or not (step S204). Even when coincident areas exist, it is not possible to set a new through-hole when these areas do not have sufficient space. Therefore, when these coincident areas do not have sufficient space, the wiring process of the extracted pair of wirings finishes. When the coincident areas have sufficient space, a projection of the coincident areas to the first layer is determined as a setting area, and a projection of the coincident areas to the second layer is determined as an corresponding area. Then, the process proceeds to step S205. In the example shown in FIG. 1, the coincident areas extracted at step S203 have sufficient space. Therefore, of the coincident areas, a part of the area of the a-wiring 1 is determined as a setting area, and a part of the area of the A-wiring 8 is determined as an corresponding area.

Finally, on the coincident areas, a through-hole is actually set between the setting area in the first layer and the corresponding area in the second layer (step S205) In the example shown in FIG. 1, the new through-hole 7 is set between the setting area on the a-wiring 1 and the corresponding area on the A-wiring 8, in addition to the through-hole 5 set by the automatic wiring.

The process at steps S202 to S205 is carried out for all pairs of wirings disposed on different layers of the semiconductor integrated circuit. In the example shown in FIG. 1, after finishing the setting of the through-hole between the a-wiring 1 and the A-wiring 8, a similar processing is carried out between the a-wiring 2 disposed on the first layer and the A-wiring 8 disposed on the second layer. This similar processing is sequentially carried out for other pairs of wirings not shown in the drawing. There are not areas that coincide with each other between the a-wiring 2 and the A-wiring 8. Therefore, no through-hole is set other than the through-hole 6 that has been set by the automatic wiring.

As explained above, according to the method of wiring a semiconductor integrated circuit in the first embodiment, there is employed a method of searching an area occupied by the wiring for an area in which a through-hole can be set, without changing the wiring already disposed by the automatic wiring. Therefore, this method has an advantage that it is not necessary to change a wiring pattern in order to set a new through-hole. As a result, this method has an advantage that it takes a shorter time for the wiring than when a new through-hole is set by changing a wiring pattern after once carrying out the automatic wiring.

As no change is made in other wirings, this method has an advantage in that characteristics of the semiconductor integrated circuit are not lowered like the disconnection of other wirings due to the setting of new other through-hole or the loss of synchronization between a plurality of circuit elements.

The through-hole that is newly set has a shape similar to the shape of the through-hole set at step S201. Therefore, this method has an advantage that it is possible to form the through-hole easily by using an existing device in the actual process of manufacturing a semiconductor integrated circuit.

Moreover, it is not always necessary to carry out the first wiring by the automatic wiring at step S201, and it is also possible to carry out this wiring manually. In this case, it takes a longer time for the operation. However, a semiconductor integrated circuit manufactured based on this wiring has high performance. It is also possible to carry out the wiring manually for important portions, and automatically for other portions.

It is possible to manually carry out the process at step S202 afterward, and it is also desirable to carry out these steps automatically by using a computer. In this case, an automatic wiring program built in with the wiring method of the first embodiment can be used on the computer. It is also possible to use a separate program independent of the automatic wiring program.

The number of through-hole that is new set is not limited to one for a pair of wirings. For example, in FIG. 1, an additional through-hole may be set between the through-hole 5 and the through-hole 7 if possible. When the number of through-holes is large, it is possible to realize a semiconductor integrated circuit having low resistance and high electromigration proof, with improved productivity.

The setting of a through-hole is not limited to the case of setting a through-hole between adjacent two layers of the first layer and the second layer that sandwich an insulation layer between the two layers. For example, the first layer and the second layer may sandwich other layer that constitutes a circuit surface between the two layers. However, in this case, it is necessary to have a step of confirming that there is no other wiring or circuit element on the area corresponding to the area on the circuit surface sandwiched between the first and second layers, after the coincident areas have been found at step S203.

The number of wirings on the semiconductor integrated circuit is enormous. Therefore, in picking up the pairs of wirings, it is effective that pairs of wirings on which through-holes have been set by the automatic wiring are stored as data in advance, and the wiring method relating to the first embodiment is used for only these stored pairs of wirings, instead of using this wiring method for all pairs of wiring. According to this method, from steps S202 to S205, it is possible to exclude the pair of wirings like the c-wiring 4 and the D-wiring 9 that transmit mutually different electric signals and that do not require a connection between the two through a through-hole. Therefore, by this method, it is possible to shorten the time required for setting a through-hole.

Figure 3:
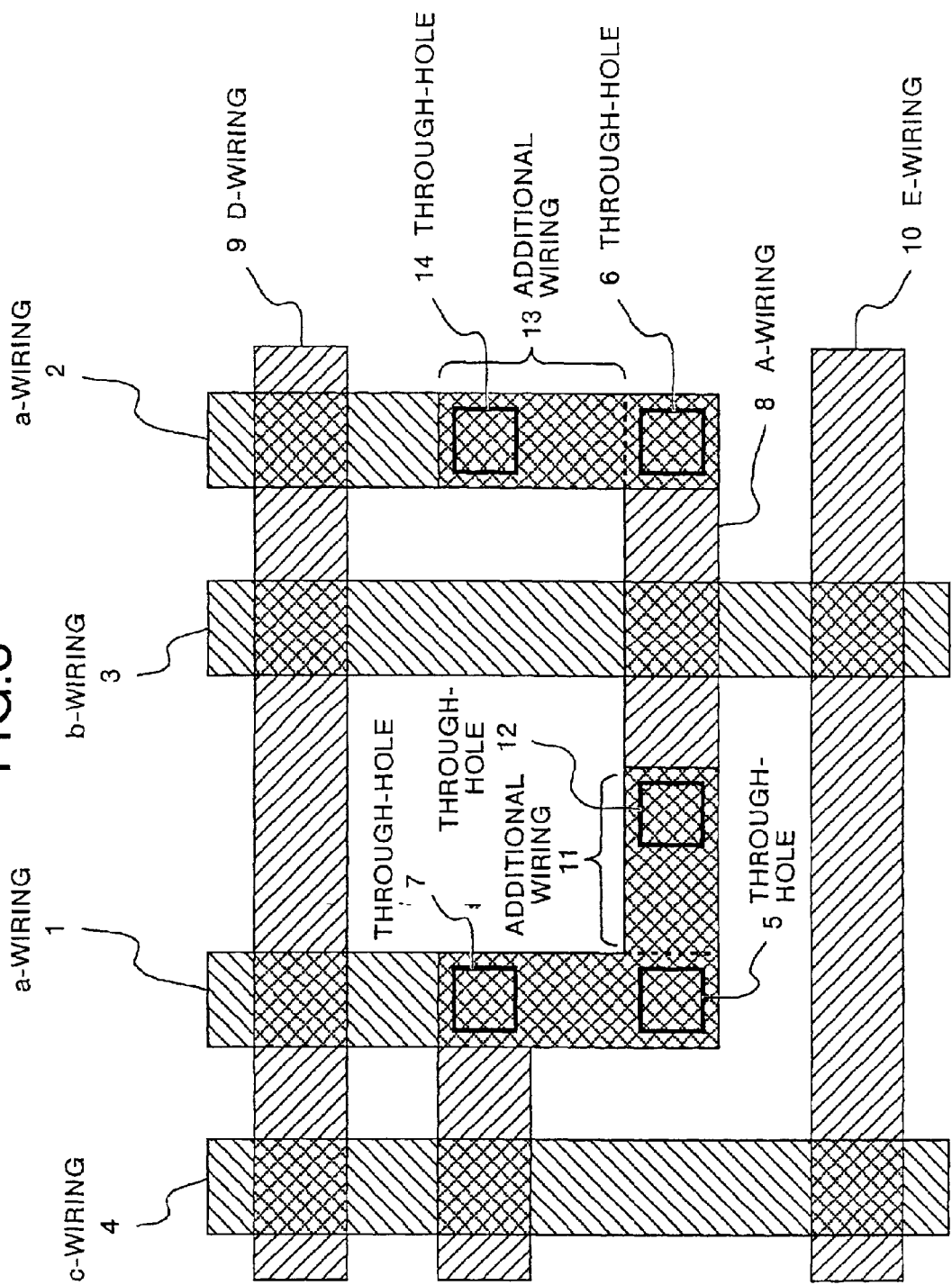
FIG. 3 is a diagram showing a wiring pattern of a semiconductor integrated circuit wired by a wiring method according to a second embodiment of the present invention.
Figure 4:
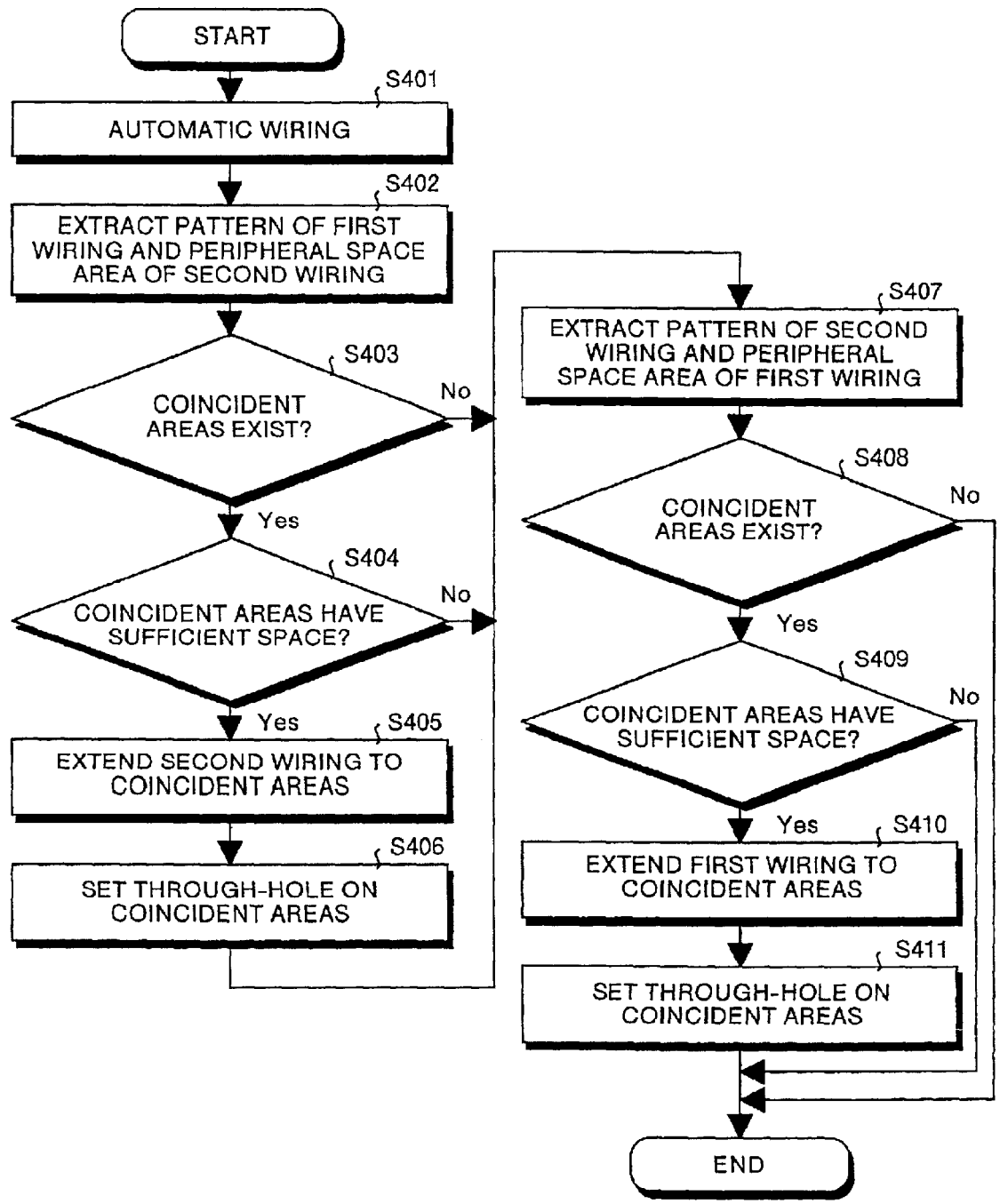
FIG. 4 is a flowchart showing a procedure of the method of wiring a semiconductor integrated circuit according to the second embodiment of the present invention.

Next, a method of wiring a semiconductor integrated circuit according to a second embodiment of the invention will be explained. FIG. 3 is a schematic view of a circuit wired by a method according to a second embodiment of the present invention. FIG. 4 is a flowchart showing an outline of the method of wiring a semiconductor integrated circuit. First, a semiconductor integrated circuit formed by the wiring method relating to the second embodiment will be explained.

FIG. 3 shows a status that wirings disposed on a first layer and wirings disposed on a second layer are superimposed with each other, in a similar manner to that shown in FIG. 1. However, the additional wiring 11, through-hole 12, additional wiring 13, and the through-hole 14 are additionally provided in the structure shown in FIG. 1.

The additional wiring 11 is disposed on the first layer, and this wiring 11 consists of a metal wiring extended in a rightward direction from the lower end of the a-wiring 1. The additional wiring 11 is superimposed with the A-wiring 8 disposed on the second layer. In the mean time, the additional wiring 13 is disposed on the second layer, and this wiring 13 consists of a metal wiring extended in a vertical direction from the right end of the A-wiring 8. The additional wiring 13 is disposed on the second layer so as to be superimposed with the a-wiring 2 disposed on the first layer. Based on the additional disposition of the wirings 11 and 13, it is possible to set more through-holes. In other words, based on the disposition of the additional wiring 11, the a-wiring 1 and the A-wiring 8 are superimposed with each other in the area at the right side of the through-hole 5. Therefore, it is possible to set the through-hole 12 in the superimposed area. Similarly, based on the disposition of the additional wiring 13, it is possible to set the through-hole 14 between the a-wiring 2 and the A-wiring 8.

Accordingly, the a-wiring 1 and the A-wiring 8 are electrically connected to each other at the three positions of the through-holes 5, 7 and 12. The a-wiring 2 and the A-wiring 8 are electrically connected to each other at the two positions of the through-holes 6 and 14. As a result, in connecting a pair of windings disposed in different layers, the total cross-sectional area of the through-holes becomes larger according to this method than when only one through-hole is set by the conventional method. Further, it is possible to realize a reduction in the resistance in the connection between the a-wiring 1 and the A-wiring 8, and between the a-wiring 2 and the A-wiring 8 respectively, and a further improvement in the electromigration proof. Further, even when one of the through-holes has been disconnected in the process of manufacturing a semiconductor integrated circuit, it is possible to maintain the electric connection with the remaining through-holes. Therefore, it is possible to improve the productivity of semiconductor integrated circuits.

Next, the method of wiring a semiconductor integrated circuit according to the second embodiment will be explained using a flowchart shown in FIG. 4 by suitably referring to the relationship between the a-wiring 2 and the A-wiring 8 shown in FIG. 3.

First, the automatic wiring is carried out using the conventional method (step S401). This step is carried out in a similar manner to that of the first embodiment. The wiring is carried out subject to the condition that one through-hole is set between a pair of wirings that are disposed on different layers and that need to be electrically connected to each other.

Next, a pair of wirings that need to be electrically connected to each other are selected from among the wirings determined by the automatic wiring. Then, a first wiring pattern disposed on the first layer and a peripheral space area of a second wiring disposed on the second layer are extracted (step S402). The peripheral space area is an area that is close to the wiring for which a through-hole is to be set. This is an area on the layer where other wiring or circuit element is not disposed except the wiring to be connected, and this area is at a predetermined distance from other wiring. This is the area with a predetermined distance from other wiring, because when this area is very close to other wiring even when other wiring is not disposed in this area, it is not possible to provide an additional wiring from the viewpoint of securing insulation between the wirings and preventing the occurrence of parasitic capacity.

Next, it is decided whether there exist coincident areas or not (step S403). Specifically, the first layer from which the first wiring has been extracted and the second layer from which the peripheral space area has been extracted are superimposed with each other. With this arrangement, an area of the first wiring and an area of the second wiring that coincide with each other are extracted. In the example shown in FIG. 3, the a-wiring 2 and the peripheral space area of the A-wiring 8 are superimposed with each other in the upper area at the right end of the A-wiring 8. Therefore, at this step, the extraction is carried out based on the decision that there are an area of the first wiring and an area of the second wiring that coincide with each other. On the other hand, when a decision has been made that there are not an area of the first wiring and an area of the second wiring that coincide with each other, the process proceeds to step S407.

Next, it is decided whether the coincident areas have sufficient space or not (step S404). Specifically, it is decided whether the coincident areas extracted at step S403 have sufficient space for setting a through-hole or not. When the coincident areas have sufficient space, a projection of the coincident areas to the first layer is determined as a setting area, and a projection of the coincident areas to the second layer is determined as an corresponding area. Then, the process proceeds to step S405. When it has been decided at this step that the coincident areas extracted at step S403 do not have sufficient space for setting a through-hole, the process proceeds to step S407. In the example shown in FIG. 3, the area of the a-wiring 2 and the peripheral space area of the A-wiring 8 that have coincided with each other have sufficient space. Therefore, the process proceeds to step S405.

Next, the wiring is extended to the coincident areas (step S405). Although one wiring has been disposed in advance in the setting area of the first layer, the corresponding area in the second layer is the area close to the other wiring. In this status, it is not possible to electrically connect between the one wiring and the other wiring even when a through-hole is set between the setting area and the corresponding area. Therefore, at step S405, an additional wiring is extended from the second wiring to the coincident areas. In the example shown in FIG. 3, the additional wiring 13 is extended from the right end portion of the A-wiring 8 to the upward direction on the second layer.

Next, a through-hole is set in the coincident areas (step S406). As the wiring has been extended to the coincident area at step S405, it is possible to electrically connect between one wiring on the first layer and the other wiring on the second layer by setting the through-hole in the coincident areas. In the example shown in FIG. 3, the through-hole 14 is provided on the upper portion of the additional wiring 13.

Next, the peripheral space area of the first wiring disposed on the first layer and the pattern of the second wiring disposed on the second layer are extracted (step S407).

Next, the first layer and the second layer are superimposed with each other, and it is decided whether there exist coincident areas in the areas extracted at step S407 (step S408). When there exist coincident areas, these areas are extracted, and the process proceeds to the next step S409. When there are no coincident areas, the wiring process for this pair of wirings is finished. In the example shown in FIG. 3, there exist no coincident areas between the A-wiring 8 and the peripheral space area on the a-wiring 2. Therefore, the wiring process finishes at this step.

Next, when there exist coincident areas, it is decided whether the coincident areas have sufficient space or not (step S409). This is because the coincident areas need to have space sufficient enough to set a through-hole. When the coincident areas do not have sufficient space, the wiring process for this pair of wirings is finished.

Next, the first wiring is extended to the setting area within the peripheral space area of the first wiring on the first layer (step S410). This is for securing an electric conduction between both wirings when a through-hole is set, like the processing at step S405.

Finally, a through-hole is set in the coincident areas (step S411), and the wiring process finishes. The processing at steps S402 to S411 is carried out for all pairs of wirings disposed on different layers, in a similar manner to that of the first embodiment. In the example shown in FIG. 3, a similar processing is carried out for the pair of the a-wiring 1 and the A-wiring 8, and the new through-hole 12 is provided. It is also effective to carry out the processing at steps S402 to S411 for only each pair of wirings for which one through-hole has been set by the automatic wiring.

Figure 5:
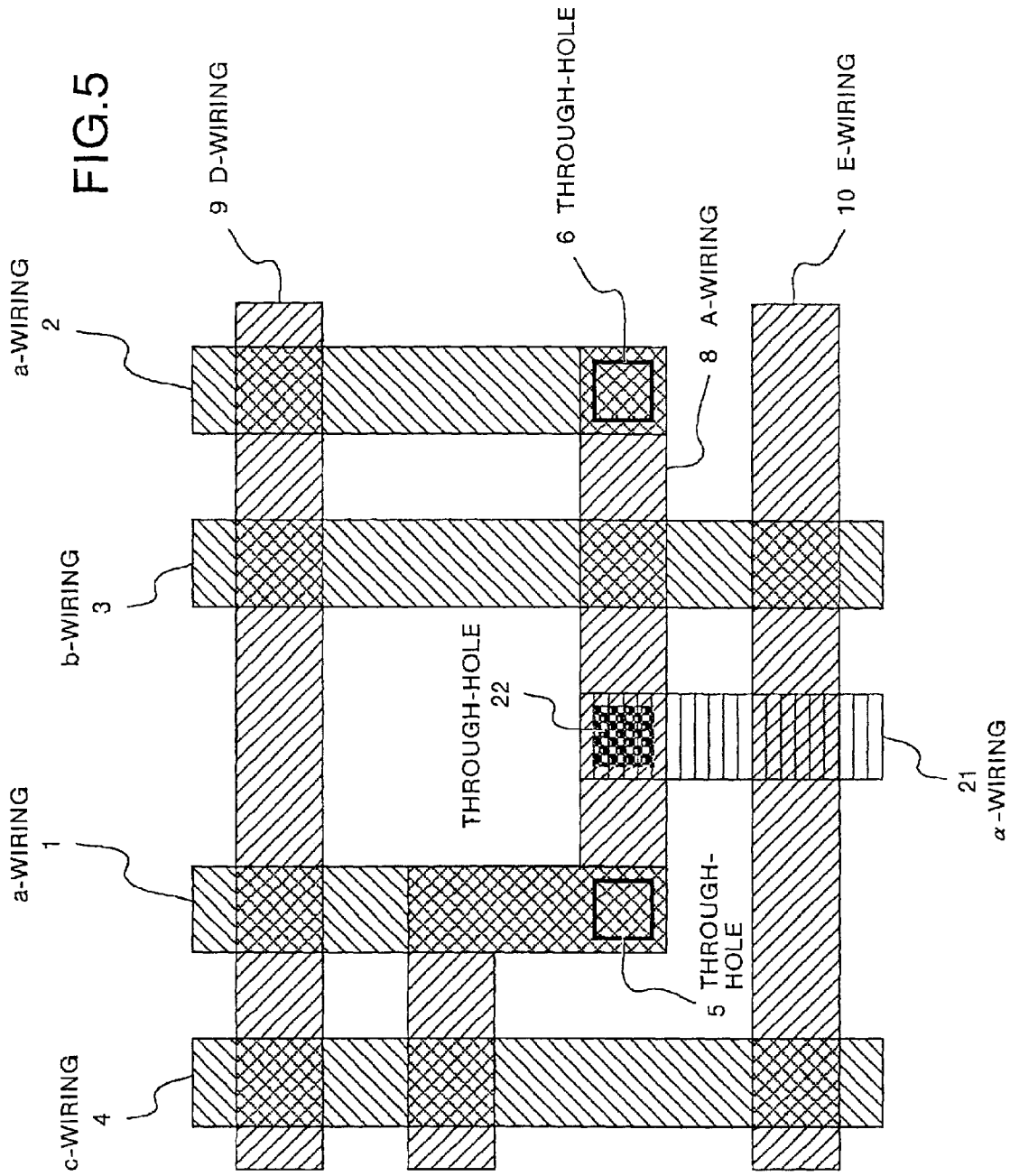
FIG. 5 is a diagram showing another wiring pattern of a semiconductor integrated circuit wired by the wiring method according to a second embodiment of the present invention.
Figure 6:
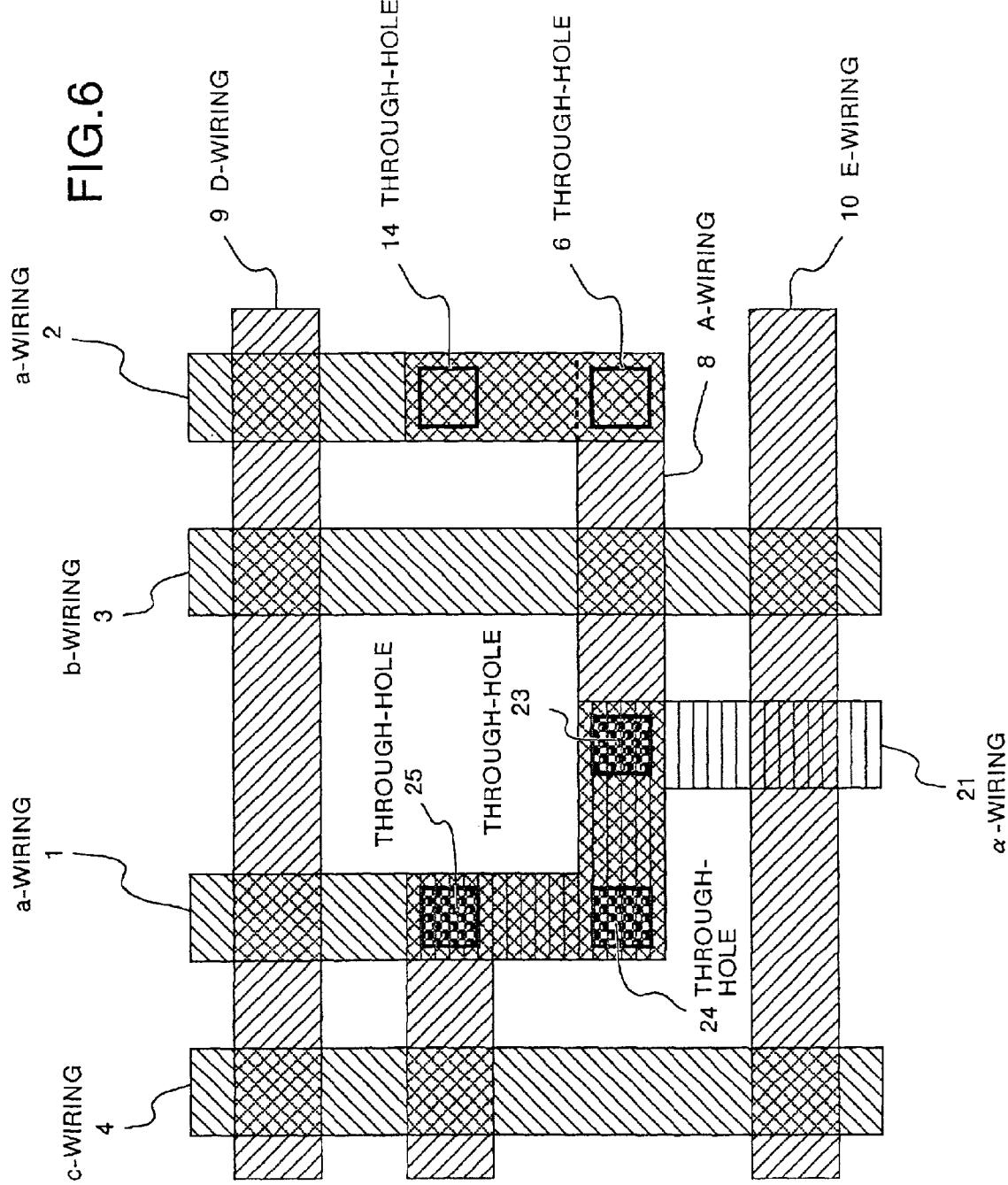
FIG. 6 is a diagram showing still another wiring pattern of a semiconductor integrated circuit wired by the wiring method according to a second embodiment of the present invention.

Now a modification of the method according to the second embodiment will be explained. It is also possible to set a through-hole between the wirings disposed on three different layers not only the setting of a through-hole between the wirings disposed on two different layers, by using the method of wiring a semiconductor integrated circuit according to the second embodiment. FIG. 5 schematically shows a semiconductor integrated circuit that has been wired according to the conventional method. An α-wiring 21 disposed on a third layer is also shown in addition to a first layer and a second layer. The α-wiring 21 transmits the same electric signal as the electric signal transmitted by an a-wiring 1 on the first layer and an A-wiring 8 on the second layer respectively. Therefore, it is necessary that the α-wiring 21 is electrically connected to the A-wiring 8, and a through-hole 22 has been set for this purpose by the automatic wiring. FIG. 6 shows a status that, in the semiconductor integrated circuit shown in FIG. 5, the α-wiring 21 has been extended along the A-wiring 8 from its upper end to the left direction, and two new through-holes 24 and 25 have been set between the α-wiring 21 on the third layer and the A-wiring 8 on the second layer, by using the wiring method according to the second embodiment. The through-holes 5 and 7 have already been set between the first layer and the second layer in the areas where the through-holes 24 and 25 are set. Therefore, by setting through-holes piercing through the first layer to the third layer, it is possible to set the through-holes between the three different layers in the actual manufacturing process.

Figure 7:
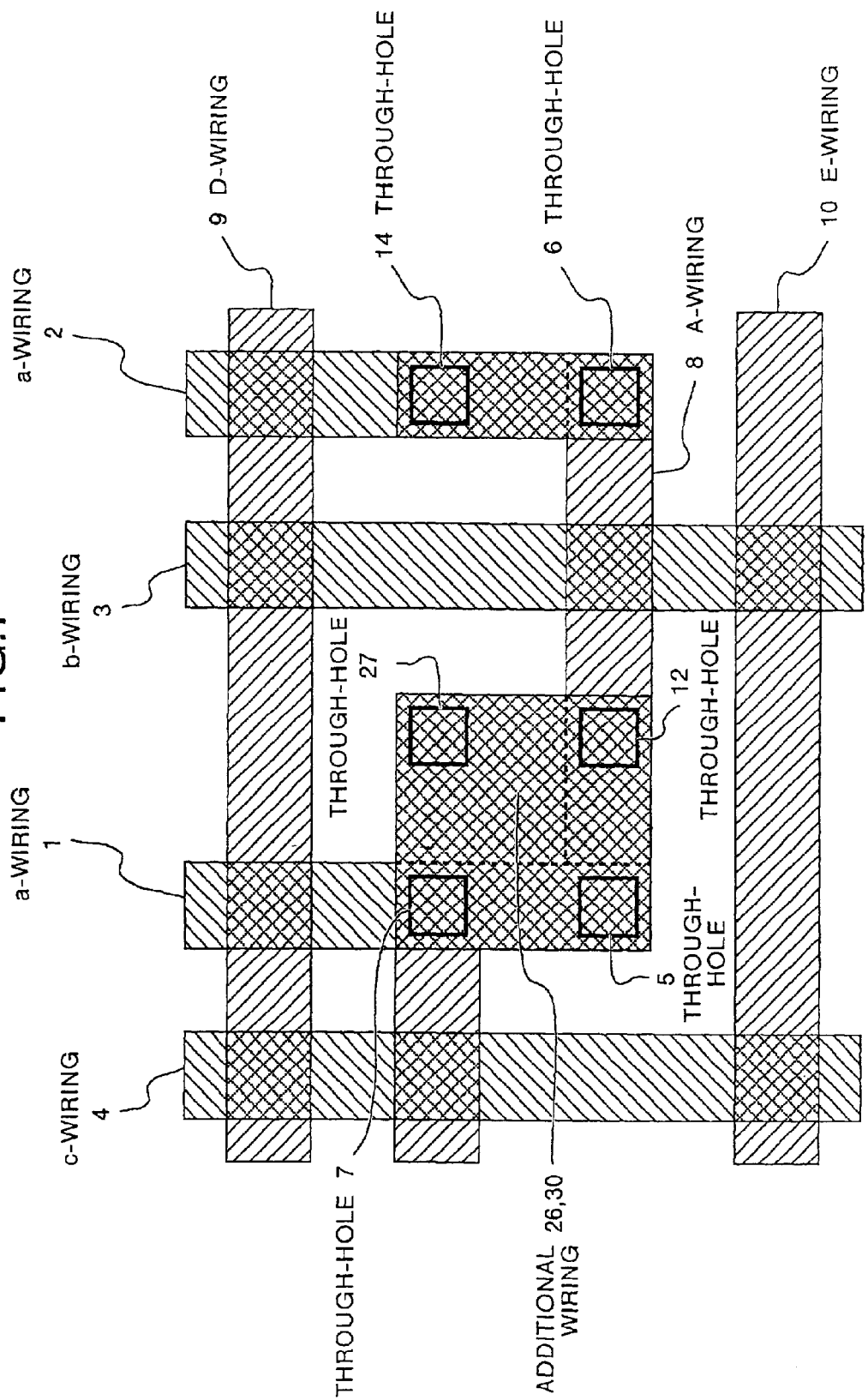
FIG. 7 is a diagram showing a wiring pattern of a semiconductor integrated circuit wired by a wiring method according to a third embodiment of the present invention.
Figure 8:
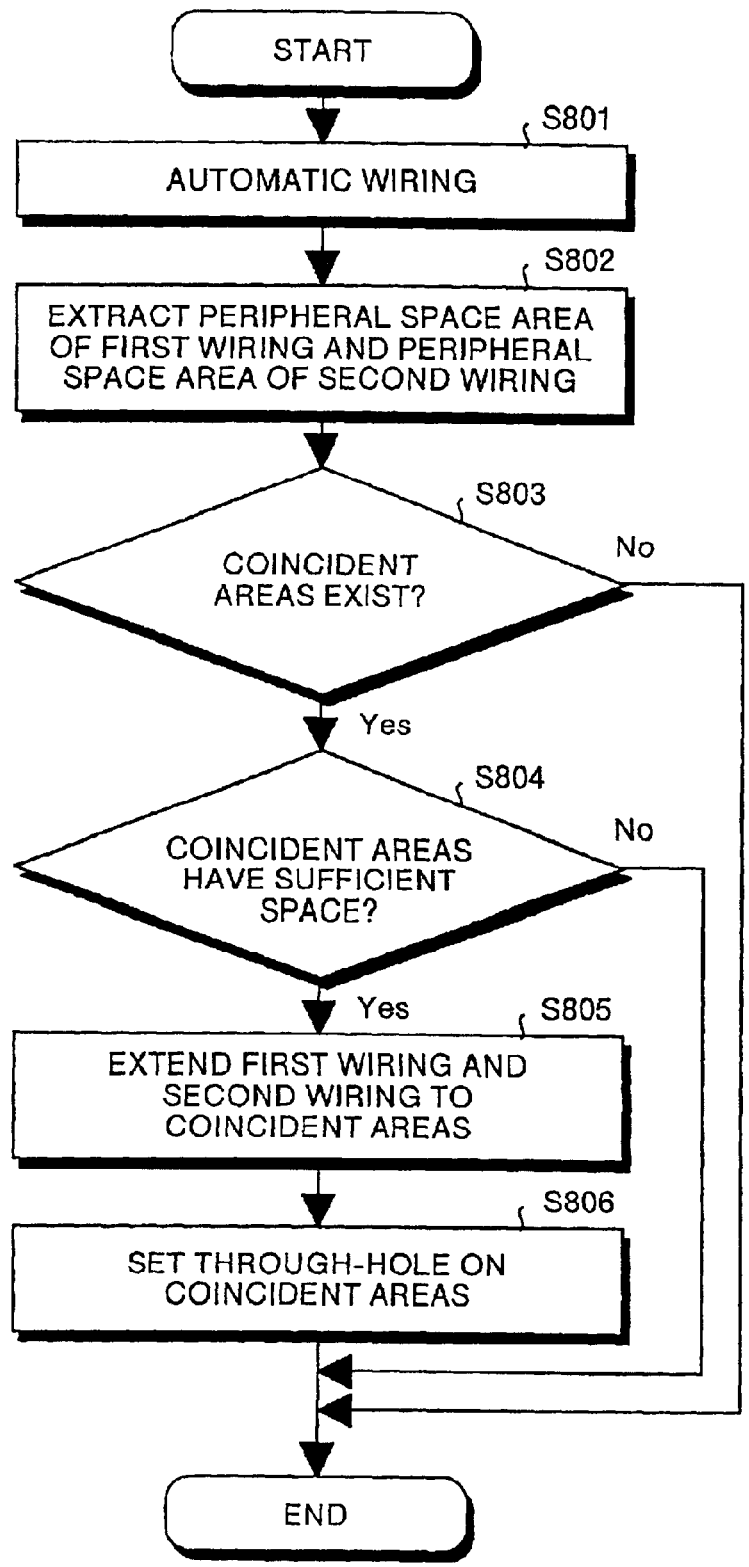
FIG. 8 is a flowchart showing a procedure of the method of wiring a semiconductor integrated circuit according to the third embodiment of the present invention.

Next, a method of wiring a semiconductor integrated circuit according to a third embodiment of the invention will be explained with reference to FIG. 7 and FIG. 8. FIG. 7 is a schematic view of a circuit wired by the method of wiring a semiconductor integrated circuit according to the third embodiment. FIG. 8 is a flowchart showing an outline of the method of wiring a semiconductor integrated circuit. First, a semiconductor integrated circuit formed by the wiring method according to the third embodiment will be explained with reference to FIG. 7.

As shown in FIG. 7, the additional wiring 26 is extended from an A-wiring 8 and is disposed on a second layer, within an area encircled by the a-wiring 1, b-wiring 3, A-wiring 8, and the D-wiring 9. The through-hole 27 is provided on the additional wiring 26. The additional wiring 30 is extended from the a-wiring 1 to an area (corresponding area) of the injection of the additional wiring 26 to the first layer. A through-hole electrically connects between the additional wiring on the first layer and the additional wiring 26 on the second layer. As a result, the a-wiring 1 and the A-wiring 8 are electrically connected to each other through four through-holes 5, 7, 12 and 27. Consequently, the resistance between the wirings becomes lower, and the electromigration proof is improved, leading to further improvement in the production yield.

Next, the method of wiring a semiconductor integrated circuit according to the third embodiment will be explained. First, the layout of circuit elements of the layers that constitute the semiconductor integrated circuit and wiring patterns are determined by the automatic wiring (step S801) In this case, it is the condition that one through-hole is set for each pair of wirings that belong to different layers and that need to be electrically connected to each other, like in the first and second embodiments. Further, the circuit elements and the wiring patterns once determined are not changed at subsequent steps, like in the first and second embodiments.

Next, a pair of wirings that are disposed on different layers and that need to be electrically connected to each other are picked up, and peripheral space areas of both wirings are extracted (step S802). In this case, like in the second embodiment, the peripheral space area is an area close to the wiring to be connected. Other wiring or circuit element is not disposed on the layer to which the wiring belongs. Also, this is the area with a predetermined distance from other wiring.

Next, it is decided whether or not there exist coincident areas between the peripheral space areas of the extracted wirings (step S803). The coincident areas are the areas that coincide with each other viewed from the above when the layers disposed with the wirings are superimposed with each other. When there exist coincident areas, the coincident areas are extracted, and the process proceeds to the next step S804.

Next, it is decided whether the coincident areas that have been extracted at step S803 have sufficient space or not (step S804). When the coincident areas do not have sufficient space, it is not possible to set a through-hole, and the wiring process finishes there. When the coincident areas have sufficient space, an area of a projection of the coincident areas to the first layer is determined as a setting area, and an area of a projection of the coincident areas to the second layer is determined as an corresponding area. Then, the process proceeds to the next step S805.

Next, the wiring is extended to the coincident areas (step S805). Specifically, the first wiring is extended to the setting area as the projection of the coincident areas to the first layer, and the second wiring is extended to the corresponding area as the projection of the coincident areas to the second layer. In FIG. 7, at step S805, the additional wiring 26 is connected to the A-wiring 8 and is disposed in the setting area on the second layer, and the additional wiring 30 is connected to the a-wiring 1 and is disposed in the corresponding area on the first layer.

Next, a through-hole is provided on the coincident areas (step S806). Specifically, the setting area as the projection of the coincident areas to the first layer and the corresponding area as the projection of the coincident areas to the second layer are connected to each other through a through-hole. At step S806, the through-hole 27 is also set in the example shown in FIG. 7. The processing at steps S802 to S806 is carried out for all pairs of wirings disposed on different layers. Then, the wiring method according to the third embodiment is finished.

According to the method of wiring a semiconductor integrated circuit in the third embodiment, a new wiring and a through-hole are set without changing the wiring patterns provided by the conventional method. Therefore, there is an advantage that no influence is applied to the characteristics of the semiconductor integrated circuit excluding the connection between the layers.

An additional wiring is disposed on a space area in which no circuit element or wiring has been disposed and which plays no particular role as a result of carrying out the automatic wiring. Therefore, it is possible to realize the improvement in the connection between the layers by effectively utilizing the space areas.

The additional wiring extended from the wiring to be connected is positioned with a predetermined distance from other wiring or circuit element. Therefore, it is possible to maintain the insulation from other wirings, and it is also possible to restrict the occurrence of parasitic capacity.

Figure 9:
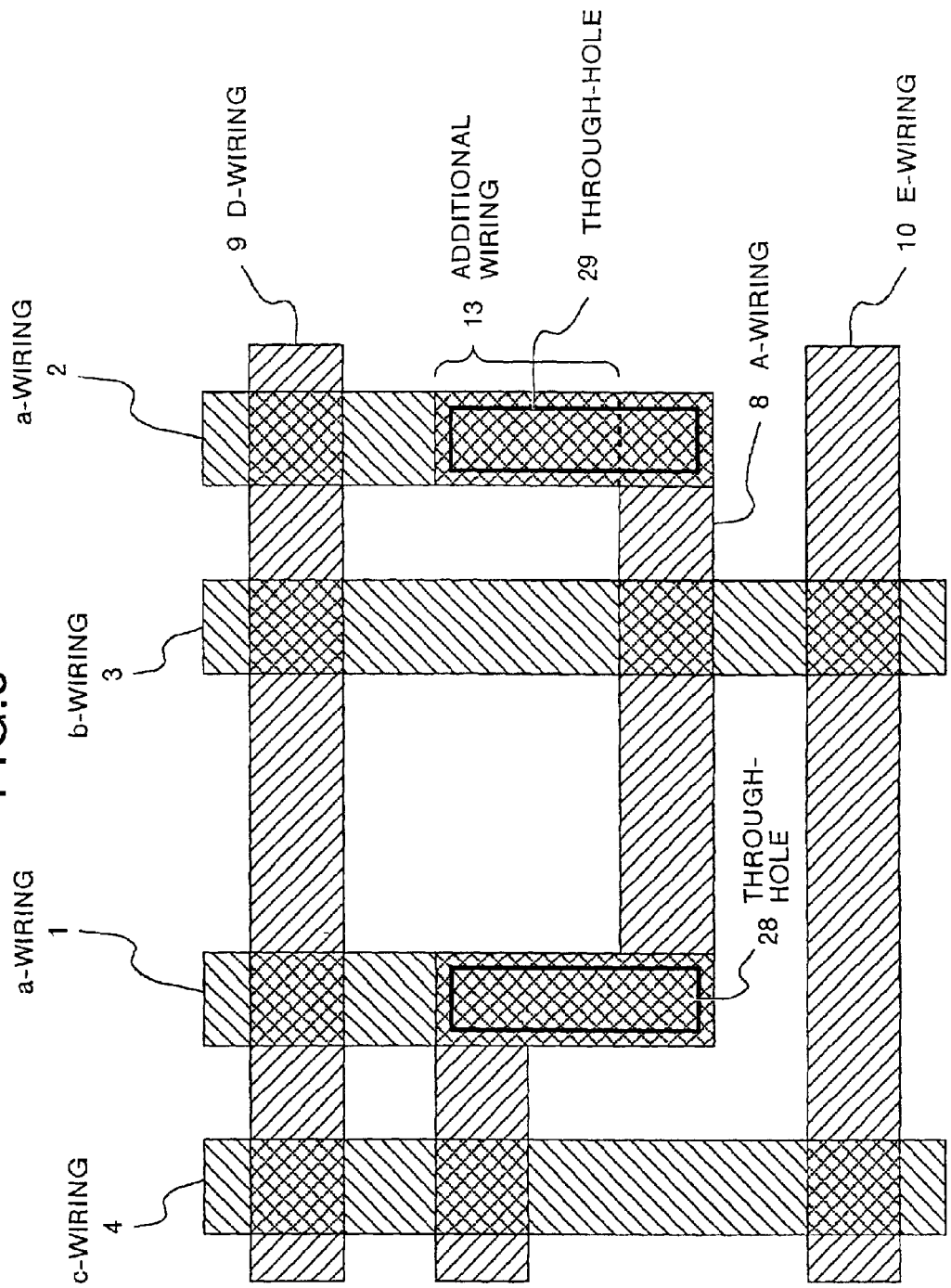
FIG. 9 is a diagram showing a wiring pattern of a semiconductor integrated circuit according to a fourth embodiment of the present invention.
Figure 10:
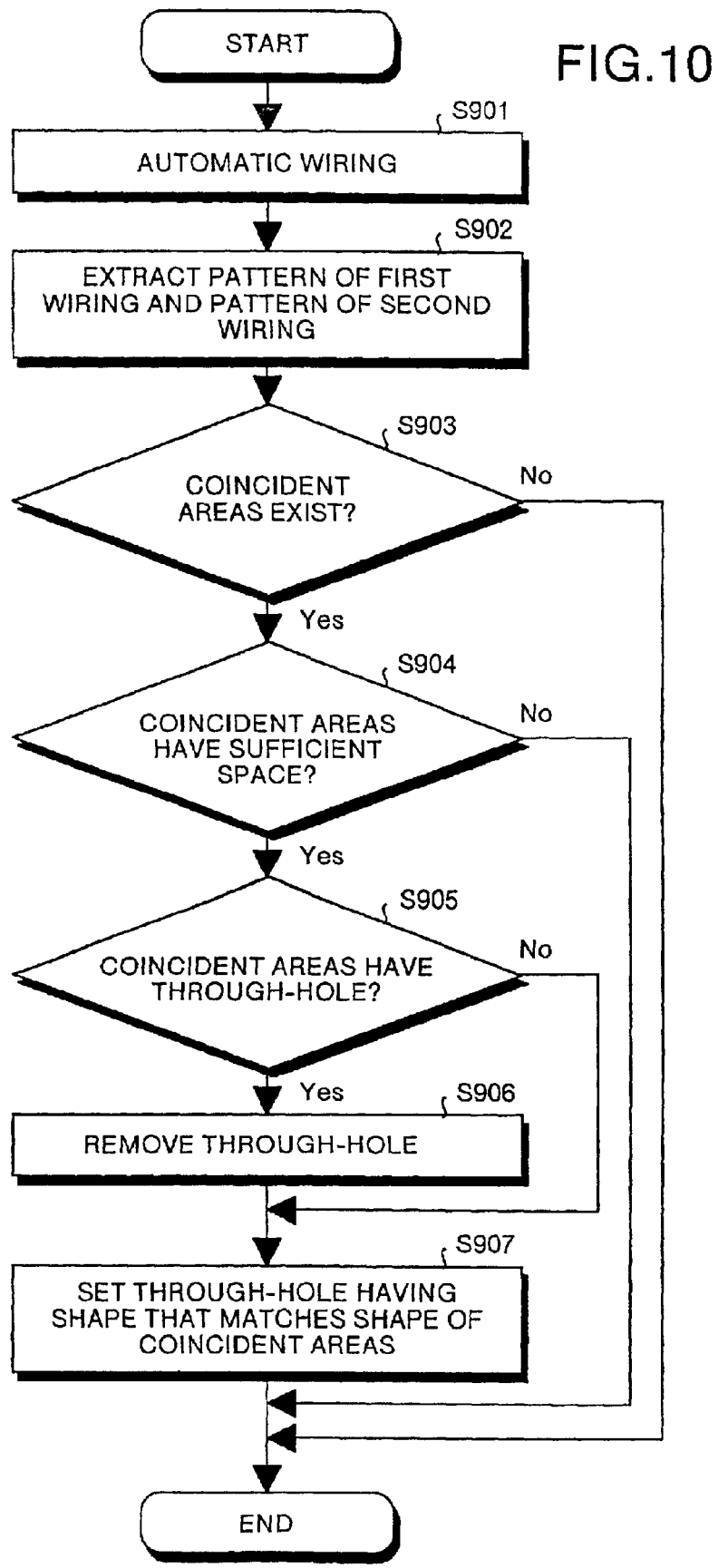
FIG. 10 is a flowchart showing a procedure of a method of wiring the semiconductor integrated circuit according to the fourth embodiment of the present invention.

FIG. 9 is a schematic view of a circuit wired by a method of wiring a semiconductor integrated circuit according to a fourth embodiment of the present invention. FIG. 10 is a flowchart showing an outline of the method of wiring a semiconductor integrated circuit. First, a semiconductor integrated circuit formed by the wiring method according to the fourth embodiment will be explained with reference to FIG. 9.

FIG. 9 shows a status that wirings disposed on a first layer and wirings disposed on a second layer in the semiconductor integrated circuit having a multi-layer structure are superimposed with each other. The a-wirings 1 and 2, b-wiring 3, and the c-wiring 4 are wirings disposed on the first layer. The A-wiring 8, D-wiring 9, and the E-wiring 10 are wirings disposed on the second layer. It is necessary to electrically connect between the a-wiring 1 on the first layer and the A-wiring 8 on the second layer, and between the a-wiring 2 on the first layer and the A-wiring 8 on the second layer, in order to transmit the same signals respectively. For this purpose, these wirings are connected to each other through through-holes 28 and 29 respectively.

In this case, the cross-sections of the through-holes 28 and 29 have shapes corresponding to the areas in which the wiring patterns to be connected coincide with each other. The through-hole 28 and the through-hole 29 have the same shapes. This is because the coincident areas between the wirings have mutually the same shapes. However, the shapes of the through-holes are not limited to those shown in FIG. 9. It is possible to set through-holes to match the shapes of the coincident areas as far as the actual manufacturing permits. The setting of the shapes of the through-holes in the semiconductor integrated circuit in the manner as described above has the following advantages.

When the coincident areas have a large size, it is possible to set a large through-hole corresponding to this cross-section. When the shape of the cross-section of the through-hole has been determined in a constant shape, the areas other than those where through-holes have been set in the coincident areas cannot be used for wiring, and these areas become useless. This is not desirable from the viewpoint of a reduction in electric resistance in the connection between the layers and improvement in the electromigration proof. On the other hand, it is possible to have a large cross-section in the through-hole when the shape of the through-hole is matched with the shape of the coincident areas. As a result, the electric resistance becomes smaller by that extent, and the density of current that flows through the through-hole becomes lower. Consequently, this has an advantage that the electromigration proof improves.

When the coincident areas have only small space, there is an advantage that it is possible to set a through-hole. When the shape of the cross-section of the through-hole has been determined in a constant shape, it is not possible to set a through-hole on the coincident areas having a smaller space than that of this shape. On the other hand, according to the third embodiment, it is possible to set a through-hole by changing its shape in an are a where it has not been possible to set a through-hole by the conventional method. As a result, there is an advantage that it is possible to reduce electric resistance in the connection between wirings.

Next, the method of wiring a semiconductor integrated circuit according to the fourth embodiment will be explained. First, the automatic wiring is carried out (step S901). The automatic wiring is carried out using the conventional method. The layout of circuit elements and wiring patterns are determined subject to the condition that one through-hole is set between the wirings that are disposed on different layers and that need to be electrically connected to each other. In the automatic wiring, through-holes have all the same shapes under the conventional method. In the example shown in FIG. 9, a through-hole is set at a lower end of the a-wiring 1 between the a-wiring 1 and the A-wiring 8, although this through-hole is not shown in the drawing. The wiring patterns determined at step S901 are not changed at subsequent steps.

Next, a pair of wirings that are disposed on different layers and that need to be electrically connected to each other are picket up, and areas occupied by these wirings are extracted (step S902). In the example shown in FIG. 9, the a-wiring 1 disposed on the first layer and the A-wiring 8 disposed on the second layer are selected, and the areas occupied by these wirings are extracted.

Next, it is decided whether there exist coincident areas or not (step S903). Basically, it is possible to carry out the processing in a similar manner to that of step S203 of the wiring method in the first embodiment. However, at step S903, areas on which a through-hole has already been set by the automatic wiring are also extracted as the areas where there exist coincident areas. All the through-holes set by the automatic wiring have the same shapes. Therefore, when the coincident areas have space larger than the cross-section of the through-hole, it is necessary to set again the shape of the through-hole to match the shape of the coincident areas. Accordingly, in the fourth embodiment, it is decided that there exist coincident areas at the lower end portion of the a-wiring 1, and then the following step is carried out.

Next, it is decided that whether the coincident areas have sufficient space or not (step S904). The sufficient space in this case is different from that defined in the first to third embodiments. The sufficient space in this case is space in which it is possible to physically set a through-hole. Therefore, even when the coincident areas have a smaller cross-sectional area than that of a through-hole set by the automatic wiring, there is a case where it is decided that the coincident areas have sufficient space at step S904. In the example shown in FIG. 9, as the area of the a-wiring 1 and the area of the A-wiring 8 that coincide with each other have sufficient space, the process proceeds to step S905.

Next, it is decided whether the coincident areas have already a through-hole or not (step S905). In the areas where a through-hole has already been set by the automatic wiring, it is necessary to once remove the through-hole, and then set a through-hole to match the shape of the coincident area. In the example shown in FIG. 9, a through-hole has not been set in the coincident areas. Therefore, the process proceeds to step S906. When there is no through-hole, the process proceeds to step S907.

Next, a through-hole is removed (step S906). By removing the through-hole that has been set by the automatic wiring, it is possible to set a through-hole again that matches the shape of the coincident areas. In the example shown in FIG. 9, a through-hole has been set to the lower end of the a-wiring 1 at the time of the automatic wiring. Therefore, this through-hole is removed.

Next, a through-hole that matches the shape of the coincident areas is set (step S907). In the example shown in FIG. 9, the coincident areas have a rectangular shape having a long side in the vertical direction. Therefore, the through-hole 28 having a shape that matches this shape is set. Thereafter, the processing at steps S902 to S907 is carried out for all pairs of wiring that belong to different layers and that need to be electrically connected to each other. Then, the process finishes.

In the fourth embodiment, a through-hole is set in only the areas where the wiring patterns coincide with each other for a pair of wirings that need to be connected. However, it is also possible to set a through-hole by providing a new additional wiring within a range not affecting the wirings that have been determined by the automatic wiring, in a similar manner to that of the second and third embodiments. In the example shown in FIG. 9, although the area of the a-wiring 2 and the area of the A-wiring 8 have coincided with each other at only the lower end portion of the a-wiring 2 (the right end portion of the A-wiring 8) at the time of the automatic wiring, the coincident areas are extended to a vertical direction when the new additional wiring 13 is disposed. Therefore, it is possible to set the through-hole 29 to match the shape of the coincident areas including the area of the additional wiring 13 again. Similarly, additional wirings may be extended from the a-wiring 1 and the A-wiring 8 to the areas encircled by the a-wiring 1, the b-wiring 3, the D-wiring 9, and the A-wiring 8 respectively. Then, the shapes of the through-holes may be set to match the shapes of the coincident areas including the additional wirings.

In addition to the above first to fourth embodiments, it is also possible to consider various embodiments according to the present invention. For example, it is possible to carry out the wiring of a semiconductor integrated circuit by combining the first to third embodiments. After carrying out steps S201 to S205 in the method of wiring a semiconductor integrated circuit according to the first embodiment, steps S402 to S411 in the method of wiring a semiconductor integrated circuit according to the second embodiment are carried out for the same pair of wirings. Further, it is possible to carry out the wiring of a semiconductor integrated circuit by carrying out steps S802 to S806 in the method of wiring a semiconductor integrated circuit according to the third embodiment. It is also possible to combine any two optional embodiments. In this case, it is possible to set more through-holes without changing the wiring patterns determined by the automatic wiring.

Further, in the first to fourth embodiments, at the time of carrying out the automatic wiring at the beginning, it is also possible to carry out the automatic wiring subject to a condition that a predetermined number of two or more through-holes are set, not only one through-hole, for a pair of wirings that are disposed in different layers and that need to be electrically connected to each other. As compared with the case of setting one through-hole, the wiring efficiency and the degree of freedom of wiring are lowered. However, there is an advantage in that the certainty of electric conduction to a pair of wirings increases. For example, the automatic wiring may be carried out such that one through-hole cell having two or more through-holes is set without exception. Further, in the automatic wiring, a specific pair of wirings may have different number of through-holes from that of other pairs of wirings. This similarly applies to the case of carrying out the wiring manually instead of the automatic wiring.

Further, it is possible to carry out the wiring methods in the first to fourth embodiments by executing a program prepared in advance, with a computer like a personal computer or a workstation computer. This program may be recorded on a computer-readable recording medium like a floppy disk, and a CD-ROM, and can be executed by reading it by the computer. This program can be distributed through a network like the Internet.

In executing this program, the program may include both the automatic wiring method according to the conventional method and the wiring method according to the present invention. Alternatively, the program may include only the wiring method according to the present invention separate from the program of the automatic wiring method.

As explained above, according to one aspect of the present invention, areas in which new other through-hole can be set are searched for, without changing the wiring patterns already determined. Therefore, there is an effect that it is possible to set a through-hole without lowering the characteristics of the semiconductor integrated circuit.

According to another aspect of the present invention, an additional wiring is disposed at the second wiring step. Therefore, an area in which the wiring has not been disposed at the first wiring step can be used for a setting area and an corresponding area. As a result, there is an effect that it is possible to effectively utilize the areas that have not been utilized at the first wiring step.

Further, a setting area is provided on the first wiring, and an corresponding area is provided in an area that is close to the second wiring and that does not include other circuit element. As a result, there is an effect that it is possible to effectively utilize the are a having no circuit element without affecting the existing wiring patterns.

Further, a setting area is provided in an area that is close to the first wiring and that does not include other circuit element, and an corresponding area is provided in an area that is close to the second wiring and that does not include other circuit element. As a result, there is an effect that it is possible to effectively utilize the area having no circuit element without affecting the existing wiring patterns.

Further, all new other through-holes are set to have the same shapes. Therefore, there is an effect that it is possible to set the through-holes based on the same standard, and reduce the manufacturing cost.

Further, all new other through-holes are set to have the shapes that match the shapes of the setting area. Therefore, there is an effect that it is possible to form a through-hole having a large cross-sectional area as far as possible for the setting area.

According to still another aspect of the present invention, the shape of the through-hole for connecting between the first wiring and the second wiring is matched with the shape of the area in which the through-hole is to be set. Therefore, there is an effect that it is possible to provide a semiconductor integrated circuit that has low electric resistance in the connection between the layers, high electromigration proof, and high productivity.

According to still another aspect of the present invention, the wiring method described in the present invention is developed as the computer-executable program. Therefore, there is an effect that it is possible to execute the method of the present invention with the computer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of wiring a semiconductor integrated circuit having a first layer and a second layer, the method comprising:

disposing a first wiring on a first layer of a semiconductor integrated circuit and disposing a second wiring on a second layer of said semiconductor integrated circuit, wherein said first and second wirings are arranged subject to a condition that a predetermined number of through-holes are to extend between said first and second wirings, connecting said first and second layers to each other;

searching for a setting area in said first layer, and a corresponding area in said second layer as a projection area of the setting area, that enable setting of an additional through-hole between said first and second wiring;

disposing an additional wiring for setting the additional through-hole in either the setting area or the corresponding area; and setting the additional through-hole to extend between the setting area and the corresponding area.

2. The method of wiring a semiconductor integrated circuit according to claim 1, wherein, in searching for a setting area, searching under a condition that the setting area is a part of the area in which said first wiring has been disposed, and that the corresponding area is an area that is close to said second wiring and an area in which no wiring or circuit element exists, and in arranging the additional wiring, extending said second wiring to the corresponding area.

3. The method of wiring a semiconductor integrated circuit according to claim 1, wherein, in searching for a setting area, searching under a condition that the setting area is an area that is close to said first wiring on said first layer and in which no wiring or circuit element exists, and the corresponding area is an area that is close to said second wiring on said second layer and in which no wiring or circuit element exists, and in disposing the additional wiring, extending said first wiring on said first layer to the setting area, and extending said second wiring on said second layer to the corresponding area.

4. The method of wiring a semiconductor integrated circuit according to claim 1, wherein, in setting the additional through-hole, making the shape of the additional through-hole the same as the shape of through-hole.

5. The method of wiring a semiconductor integrated circuit according to claim 1, wherein, in setting the through-hole, choosing a shape of the additional through-hole based on shape of the setting area.

6. A computer program containing instructions which when executed on a computer, causes the computer to design wiring of a semiconductor integrated circuit, having a first layer and a second layer, the method comprising:

disposing a first wiring on a first layer of a semiconductor integrated circuit and disposing a second wiring on a second layer of said semiconductor integrated circuit, wherein said first and second wirings are arranged subject to a condition that a predetermined number of through-holes are to extend between said first and second wirings, connecting said first and second layers to each other;

searching for a setting area in said first layer, and a corresponding area in said second layer as a projection area of the setting area, that enable setting of an additional through-hole between said first and second wiring;

disposing an additional wiring for selling the additional through-hole in either the setting area or the corresponding area; and setting the additional through-hole to extend between the setting area and the corresponding area.

* * * * *